(12) United States Patent
Chang

(10) Patent No.: US 7,784,605 B2
(45) Date of Patent: Aug. 31, 2010

(54) SUPPORTING DEVICE, SUBSTRATE TRANSPORTATION EQUIPMENT AND A RELATED METHOD THEREOF

(75) Inventor: Shun-Chu Chang, Hsinchu (TW)

(73) Assignee: Motech Industries Inc., Shen-Keng Hsiang, Taipei Hsien (TW)

( * ) Notice: Subject to any disclaimer, the term of this patent is extended or adjusted under 35 U.S.C. 154(b) by 546 days.

(21) Appl. No.: 11/834,014

(22) Filed: Aug. 6, 2007

(65) Prior Publication Data

US 2008/0304951 A1    Dec. 11, 2008

(30) Foreign Application Priority Data

Jun. 6, 2007    (TW) .................... 96120385

(51) Int. Cl.
*B65G 25/00* (2006.01)
(52) U.S. Cl. .................. 198/773; 198/750.14; 414/198
(58) Field of Classification Search ........... 198/750.14, 198/773, 774.1, 774.2, 774.3, 774.4
See application file for complete search history.

(56) References Cited

U.S. PATENT DOCUMENTS

| | | | | |
|---|---|---|---|---|
| 3,930,440 A | * | 1/1976 | Ohkawa | .................... 99/450.6 |
| 4,054,200 A | * | 10/1977 | Bartos | .................... 198/774.1 |
| 4,741,695 A | | 5/1988 | Ushijima | |
| 5,314,330 A | * | 5/1994 | Orbeck | .................... 432/128 |
| 6,537,011 B1 | * | 3/2003 | Wang et al. | .................... 414/217 |

FOREIGN PATENT DOCUMENTS

| | | |
|---|---|---|
| EP | 1 600 716 A1 | 11/2005 |
| EP | 1 647 789 A1 | 4/2006 |
| FR | 2 650 259 A1 | 2/1991 |
| JP | 62021607 A * | 1/1987 |
| JP | 2003-176011 | 6/2003 |
| JP | 2003-261222 | 9/2003 |

* cited by examiner

*Primary Examiner*—Mark A Deuble
(74) *Attorney, Agent, or Firm*—Winston Hsu

(57) ABSTRACT

A supporting device includes a support body for supporting a substrate and an auxiliary wing for supporting the corner of the substrate, so that the substrate is substantially horizontally disposed on the supporting device. Also disclosed is a substrate transportation equipment including the supporting device and a movable protruding member. The substrate transportation equipment can prevent the movable protruding member from hitting the edge of the substrate when the movable protruding member moves.

20 Claims, 7 Drawing Sheets

SUPPORTING DEVICE, SUBSTRATE TRANSPORTATION EQUIPMENT AND A RELATED METHOD THEREOF

BACKGROUND OF THE INVENTION

1. Field of the Invention

The present invention relates to a supporting device. In particular, the present invention relates to a supporting device which allows a substrate to be horizontally disposed thereon.

2. Description of the Prior Art

In the current solar cell production, transportation equipment is employed to transport the solar cells. In the meantime, the edges of the solar cells may droop to bend due to various reasons, such as curling of the substrate because of heated Al paste on the back of the substrate or because of an extremely thin substrate.

Once the substrates bend too much, they collide with one another and pile up while being transported and the collision causes the drop of the yield.

FIG. 1 Illustrates the conventional transportation of the substrates. The transportation equipment 100 includes the base 110, the walking beam 120 and cell seats 130, 131, 132, 133. The cell seats 130, 131, 132, 133 are fixed on the base 110. The walking beam 120 includes multiple protruding members 121 reciprocating between the cell seats 130, 131 and the cell seats 132, 133 to transport the substrate 140.

A complete cycle of the reciprocation of the walking beam 120 includes movements A-B-C-D. When the substrate bends, the far edges droop more than the ordinary ones. In the mean time, if the walking beam 120 moves along the D direction, the protruding members 121 of the walking beam 120 collide with the drooping edges of the substrate 140 on the cell seats 132, 133 and cause pile-ups. The yield therefore decreases.

It is needed to provide a novel supporting device to solve the above-mentioned problems.

SUMMARY OF THE INVENTION

The present invention provides a novel supporting device for avoiding the aforementioned abnormal situation to effectively lower the defects and increase the yield.

The present invention first provides a supporting device, which includes a support body for supporting a substrate and an auxiliary wing for supporting the corners of the substrate, so that the substrate is substantially horizontally disposed on the supporting device.

The present invention further provides a substrate transportation equipment, which includes a base and a plurality of supporting devices. The base includes a central working beam and a first base surface and a second base surface respectively disposed on both sides of the central working beam. The central working beam includes a reciprocating movable protruding member for transporting a substrate and a plurality of supporting devices correspondingly disposed on the first base surface and the second base surface. Each supporting device includes a support body for supporting the substrate and an auxiliary wing for supporting the substrate so that the substrate may be substantially horizontally disposed on the supporting devices to avoid the collision of the movable protruding member with corners of the substrate during its reciprocation.

The present invention also provides a method for transporting a substrate. The method of the present invention includes first providing a substrate transportation equipment including a base, a plurality of first supporting devices disposed on a first location of the base, a plurality of second supporting devices disposed on a second location of the base, and a working beam, disposed on a base, including a movable protruding member reciprocating between the first location and the second location. Afterwards, a substrate is substantially horizontally placed on the first supporting devices. Later the protruding member is elevated so that the protruding member replaces the first supporting devices to support the substrate. Afterwards, the protruding member and the substrate thereon altogether move from the first location to the second location along the working beam. Later the protruding member is lowered so that the substrate is off the protruding member and substantially horizontally disposed on the second supporting devices. Then the protruding member returns to the first location.

These and other objectives of the present invention will no doubt become obvious to those of ordinary skill in the art after reading the following detailed description of the preferred embodiment that is illustrated in the various figures and drawings.

DETAILED DESCRIPTION

One aspect of the present invention provides a supporting device and a substrate transportation equipment to prevent the working beam from colliding with the substrate on the base so as to effectively lower the defects and increase the yield.

Figure 1:
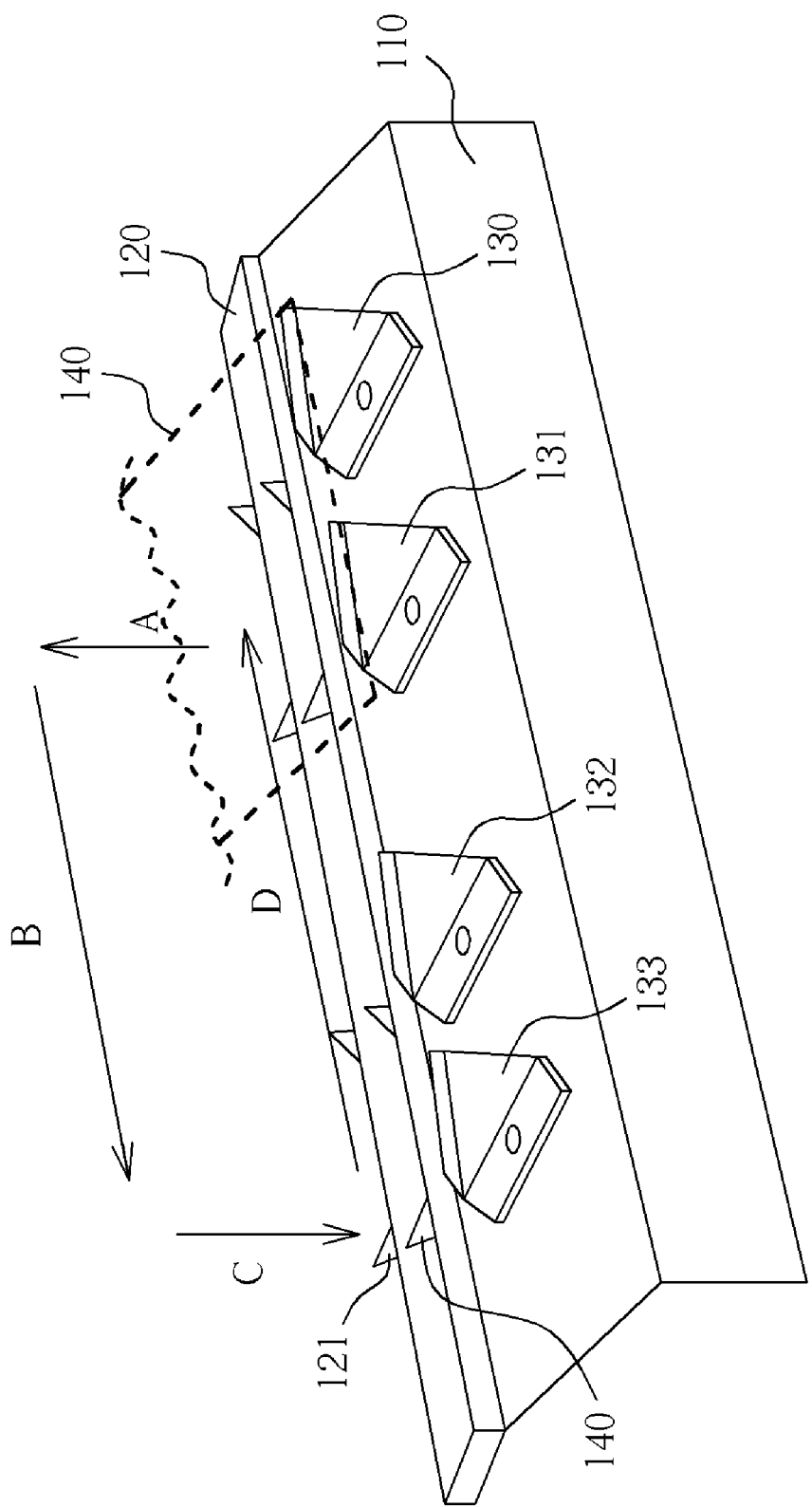
FIG. 1. Illustrates the conventional transportation of the substrates.
Figure 2:
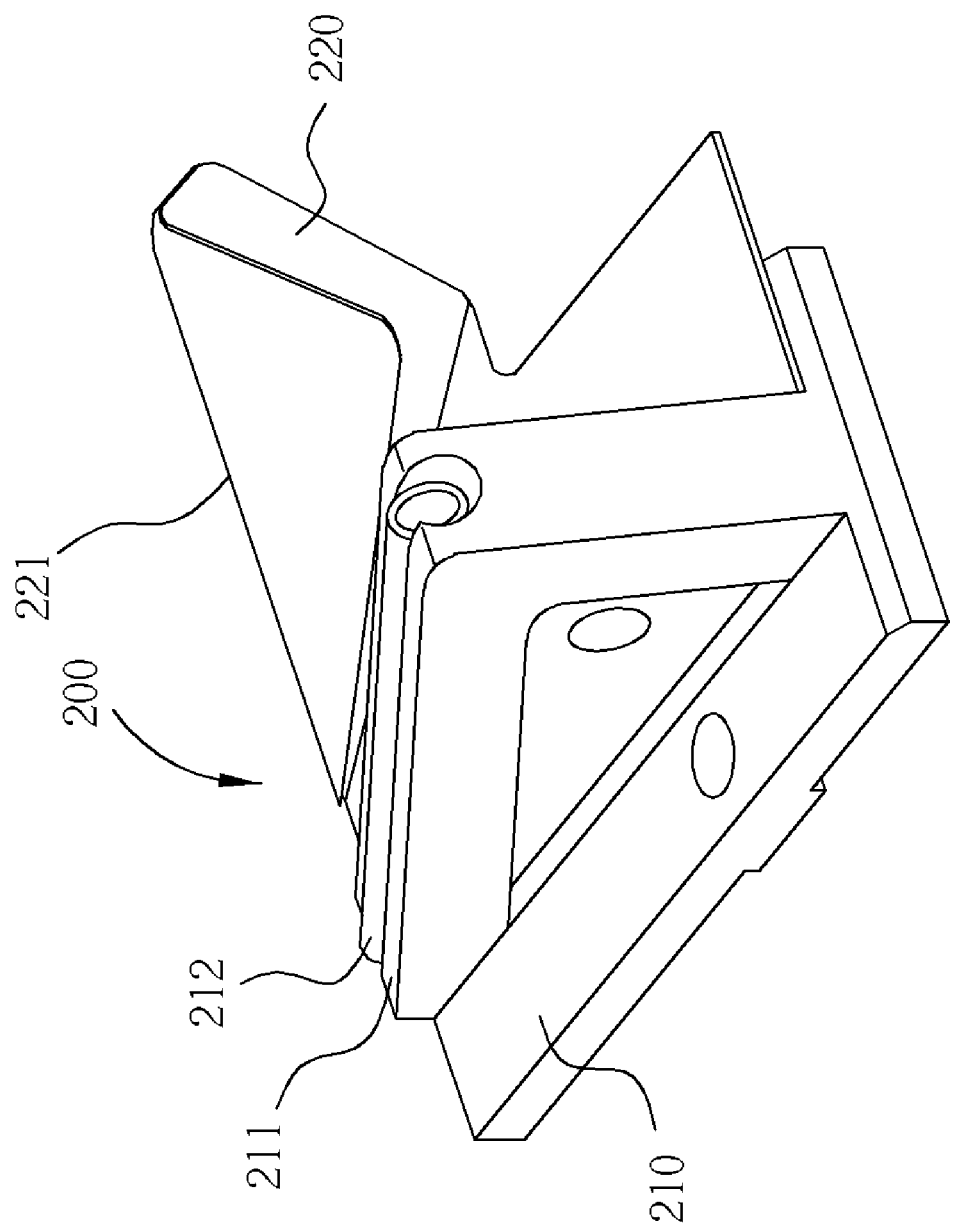
FIG. 2 illustrates the supporting device of the present invention.

FIG. 2 illustrates the supporting device 200 of the present invention. The supporting device 200 includes a support body 210 and an auxiliary wing 220. The support body 210 is useful in supporting a substrate (not shown) and the auxiliary wing 220 is useful in supporting the corners of the substrate, so that a substrate is substantially horizontally disposed on the supporting device 200.

Usually the support body 210 includes a first top surface 211 so that a substrate may lie on the first top surface 211. Preferably, the support body 210 may further include a cushion 212, made of elastic material, on the first top surface 211. Similarly, the auxiliary wing 220 may include a second top rim 221 so that the corners of a substrate may be disposed on the second top rim 221 of the auxiliary wing 220. Also, the auxiliary wing 220 may further include a pad on the second top rim 221 to avoid scratching the substrate. The auxiliary wing 220 may be made of plastic materials, such as plastics or metal, so that the auxiliary wing 220 may be adjusted manually to correctly support the corners of a substrate.

The auxiliary wing 220 may extend from the support body 210 along the diagonal direction of the substrate. According to one preferred embodiment of the present invention, the auxiliary wing 220 is detachably connected to the support body 210. Or, according to another preferred embodiment of the present invention, the support body 210 and the auxiliary wing 220 are integratedly formed. Preferably, the auxiliary wing 220 may be a bended metal plate latched to a base with the support body 210.

Figure 3:
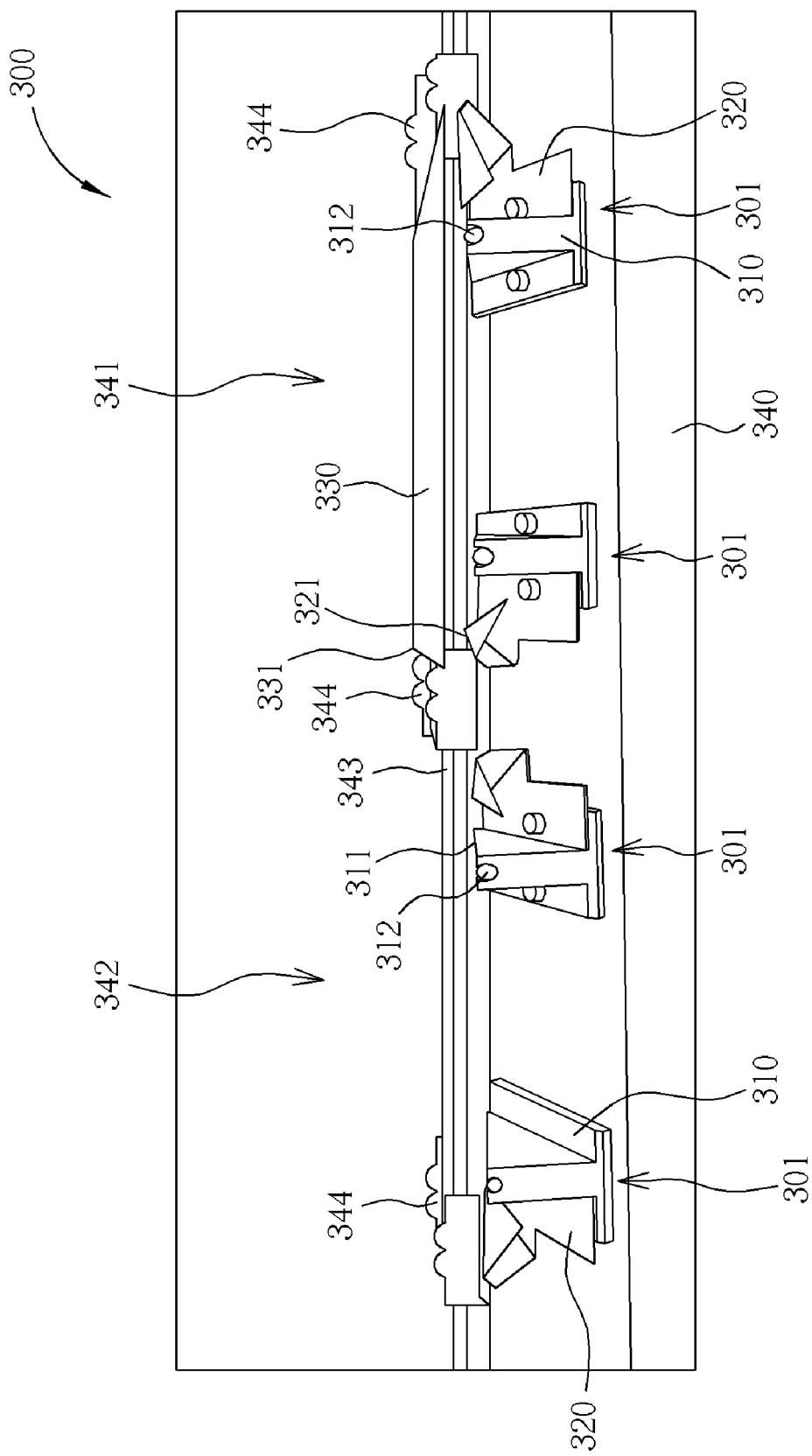
FIG. 3 illustrates the substrate transportation equipment of the present invention.

FIG. 3 illustrates the substrate transportation equipment 300 of the present invention. The substrate transportation equipment 300 includes a base 340 and a plurality of supporting devices 301. The base 340 includes a central working beam 343, a first base surface 341 and a second base surface 342. The first base surface 341 and the second base surface 342 are respectively disposed on both sides of the central working beam 343. The central working beam 343 includes a reciprocating movable protruding member 344 for transporting a substrate 330.

The supporting devices 301 which are correspondingly disposed on the first base surface 341 and the second base surface 342 respectively include a support body 310 and an auxiliary wing 320. The support body 310 is useful in supporting the substrate 330 and the auxiliary wing 320 is useful in supporting the substrate 330 so that the substrate 330 may be substantially horizontally disposed on the supporting devices 301. Because the substrate 330 can be substantially horizontally disposed on the supporting devices 301, the collision of the movable protruding member 344 with corners 331 of the substrate 330 during its reciprocation can be avoided.

The substrate 330 may be a bendable article, such as a solar cell, but is not limited to this. Usually, the support body 310 may include a first top surface 311 so that the substrate 330 may lie on the support body 310 by means of the first top surface 311. Preferably, the support body 310 may further include a cushion 312 made of elastic material, such as a plastic tube, on the first top surface 311. Similarly, the auxiliary wing 320 may include a second top rim 321 so that the corners 331 of the substrate 330 may lie on the second top rim 321 of the auxiliary wing 320. Also, the auxiliary wing 320 may further include a pad (not shown) on the second top rim 321 to avoid scratching the substrate. The auxiliary wing 320 may be made of plastic materials, such as plastics or metal, so that the auxiliary wing 320 may correctly support the corners 331 of the substrate 330.

The auxiliary wing 320 may extend from the support body 310 along the diagonal direction of the substrate 330. The auxiliary wing 320 may be detachably connected to the support body 310, or the support body 310 and the auxiliary wing 320 may be integratedly formed. Preferably, the auxiliary wing 320 may be a bended metal plate latched to the base 340 with the support body 310.

Figure 4:
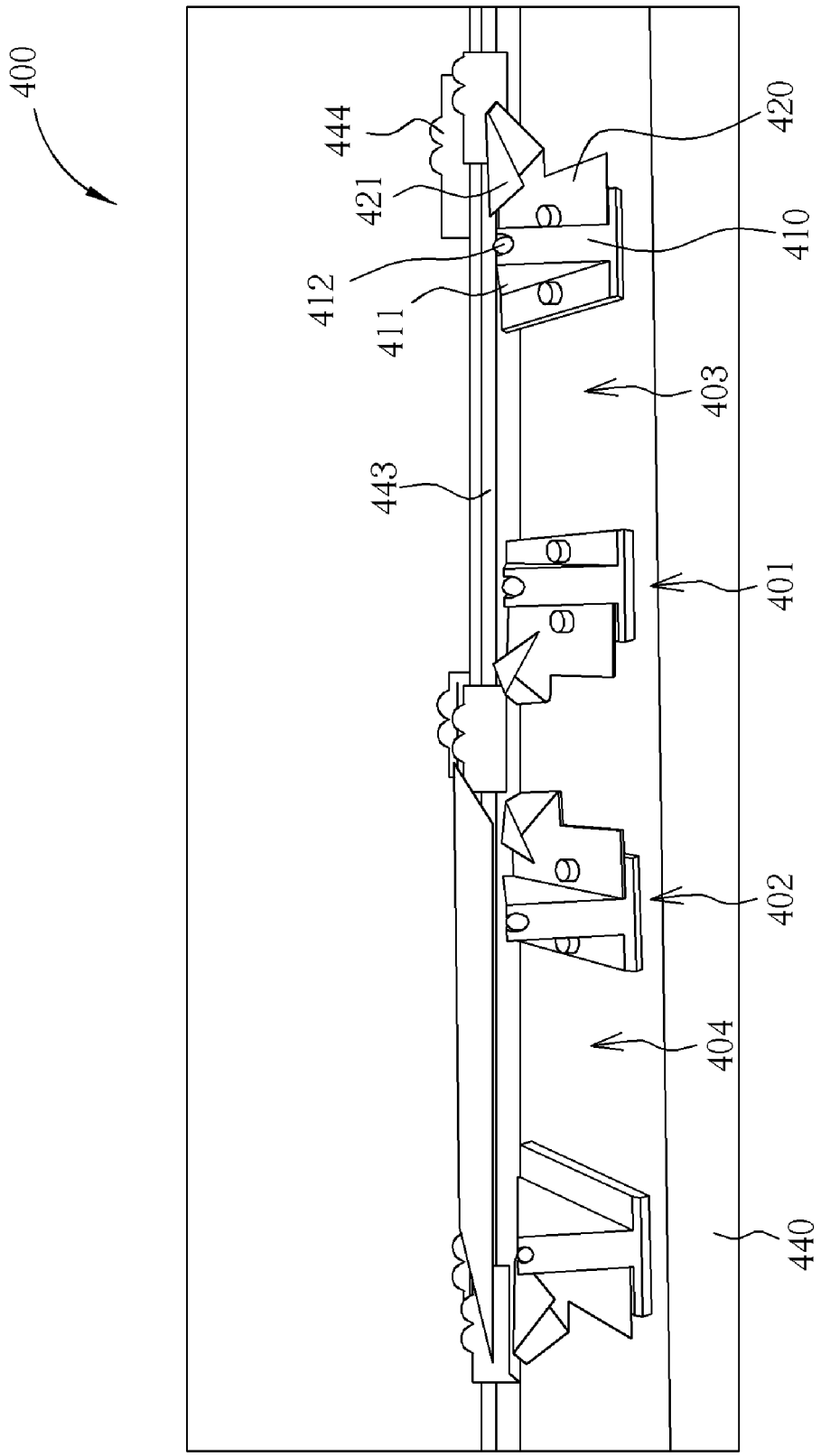
FIGS. 4-7 illustrate the method for transporting a substrate of the present invention.

FIGS. 4-7 illustrate the method for transporting a substrate of the present invention. First, as shown in FIG. 4, the substrate transportation equipment 400 includes a base 440, a plurality of first supporting devices 401 disposed on a first location 403 of the base 400, a plurality of second supporting devices 402 disposed on a second location 402 of the base 400 and disposed on the base 400 a working beam 443 including a pair of movable protruding member 444 reciprocating between the first location 403 and the second location 404.

Figure 5:
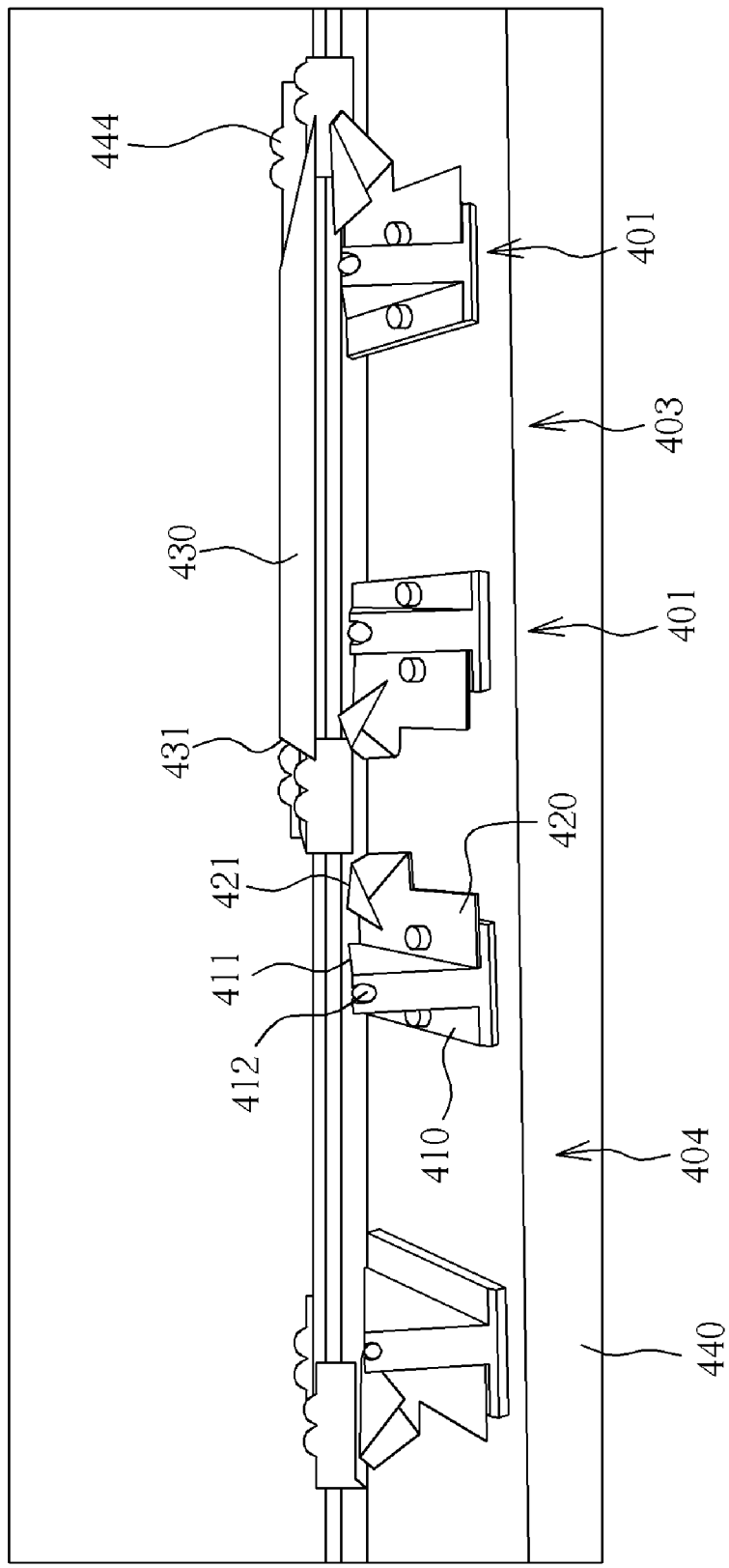

Afterwards, as shown in FIG. 5 the substrate 430 is substantially horizontally placed on the first supporting devices 401. Then the protruding member 444 is elevated so that the protruding member 444 replaces the first supporting devices 401 to support the substrate 430. Please note, the substrate 430 has corners 431.

Both the first supporting device 401 and the second supporting device 402 respectively include a support body 410 and an auxiliary wing 420. The support body 410 is useful in supporting the substrate 430 and the auxiliary wing 420 is useful in supporting the corners 431 of the substrate 430, so that the substrate 430 may be substantially horizontally disposed on the supporting device.

The substrate 430 may usually be a bendable article, such as a solar cell, but is not limited to this. Usually, the support body 410 may include a first top surface 411 so that the substrate 430 may lie on the support body 410 by means of the first top surface 411. Preferably, the support body 410 may further include a cushion 412 made of elastic material, such as a plastic tube, on the first top surface 411.

Similarly, the auxiliary wing 420 may include a second top rim 421 so that the corners 431 of the substrate 430 may lie on the second top rim 421 of the auxiliary wing 420. Also, the auxiliary wing 420 may further include a pad (not shown) on the second top rim 421 to avoid scratching the substrate. The auxiliary wing 420 may be made of plastic materials, such as plastics or metal, so that the auxiliary wing 420 may correctly support the corners 431 of the substrate 430.

The auxiliary wing 420 may extend from the support body 410 along the diagonal direction of the substrate 430. In order to allow the auxiliary wing 420 to correctly support the corners 431 of the substrate 430, the second top rim 421 may be preferably slightly lower than the first top surface 411. The auxiliary wing 420 may be detachably connected to the support body 410, or the support body 410 and the auxiliary wing 420 may be integratedly formed. Preferably, the auxiliary wing 420 may be a bended metal plate latched to the base 440 with the support body 410.

Figure 6:
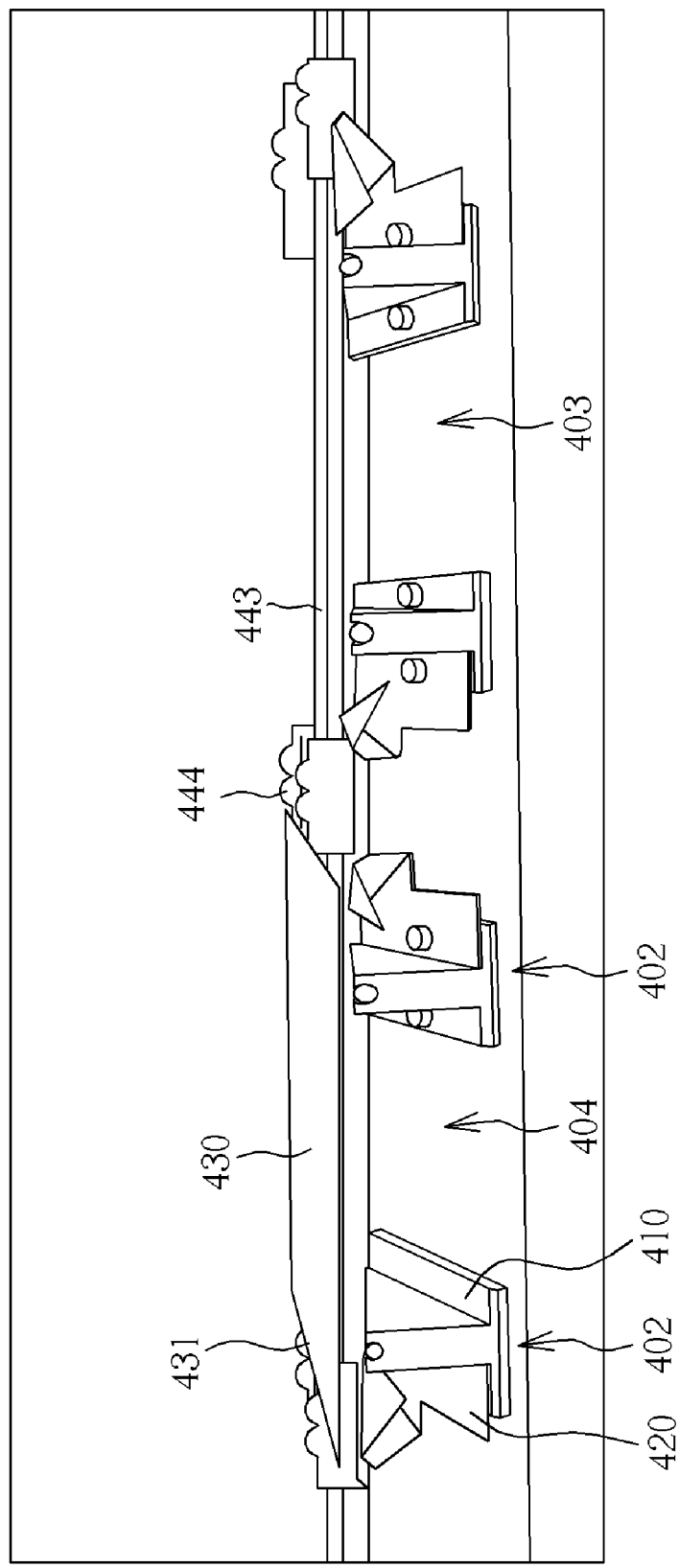

Later, as shown in FIG. 6 the protruding member 444 and the substrate 430 thereon altogether move from the first location 403 to the second location 404 along the working beam 443. The distance between the first location 403 and the second location 404 depends on the dimension of the substrate 430. The shorter the distance usually means the higher the yield.

Figure 7:
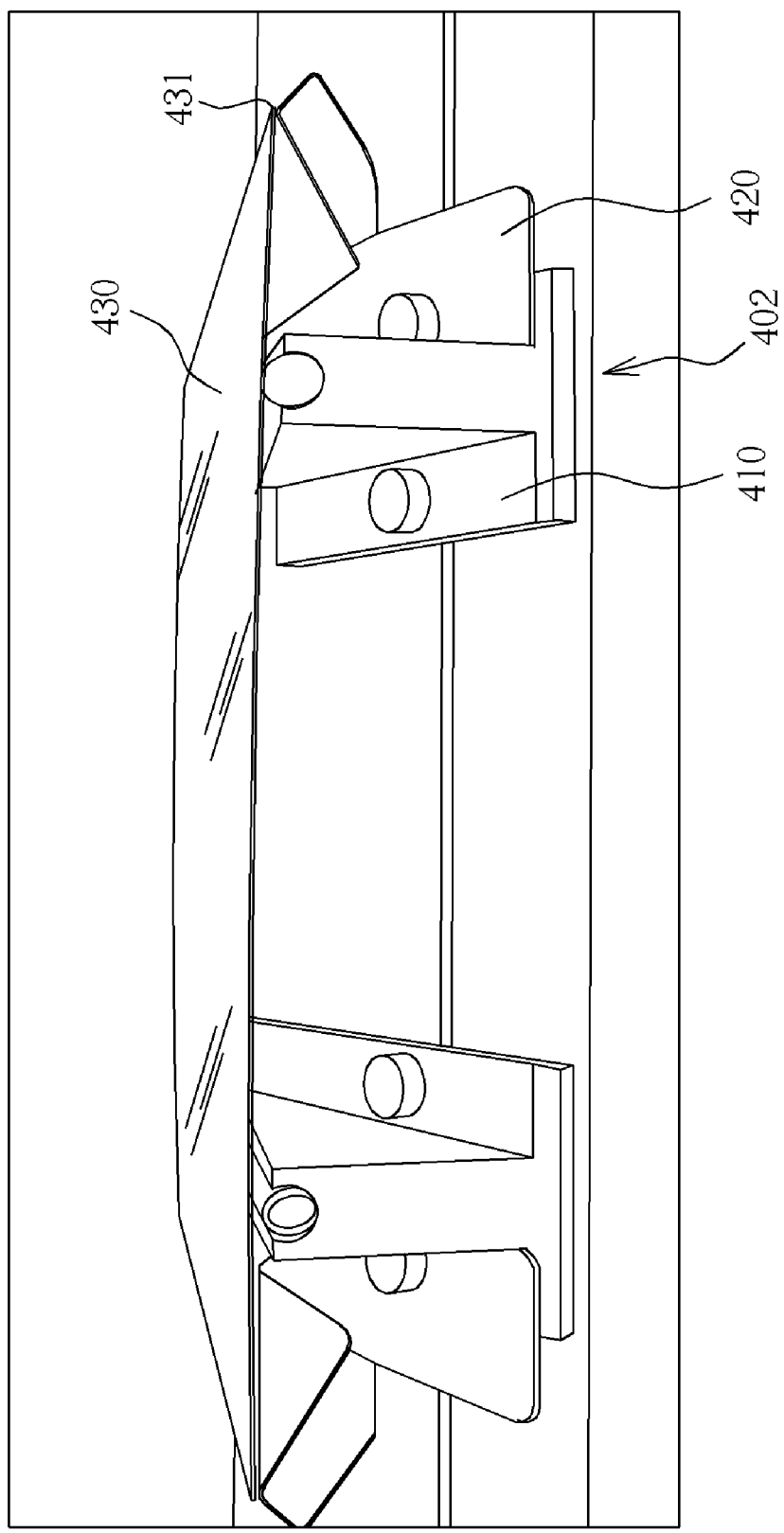

After reaching the second location 404, the protruding member 444 is lowered so that the substrate 430 is off the protruding member 444 and substantially horizontally disposed on the second supporting devices 402. As shown in FIG. 7, because the auxiliary wing 420 elevates the drooping corners 431 of the substrate 430, the substrate 430 now is substantially horizontally disposed on the supporting device 402 so the collision of the movable protruding member (not shown) with corners 431 of the substrate 430 during its reciprocation can be avoided. Accordingly, the height of the auxiliary wing 420 is preferably between the support body 410 and the protruding member 444. Afterwards the protruding member 444 returns to the first location 403.

Those skilled in the art will readily observe that numerous modifications and alterations of the device and method may be made while retaining the teachings of the invention.

What is claimed is:

1. A substrate transportation equipment comprising:
a base comprising a central working beam, and a first base surface and a second base surface respectively disposed on both sides of said central working beam, wherein said central working beam comprises a reciprocating movable protruding member for transporting a substrate; and
a plurality of supporting devices correspondingly disposed on said first base surface and said second base surface, wherein each said supporting devices comprises a support body for supporting said substrate and an auxiliary wing for supporting said substrate so that said substrate is substantially horizontally disposed on said supporting devices to avoid the collision of said movable protruding member with corners of said substrate during its reciprocation.

2. The substrate transportation equipment of claim 1, wherein said substrate comprises a solar cell substrate.

3. The substrate transportation equipment of claim 1, wherein said support body comprises a first top surface so that said substrate lies on said first top surface.

4. The substrate transportation equipment of claim 1, wherein said support body further comprises a plastic tube disposed on said first top surface for supporting said substrate.

5. The substrate transportation equipment of claim 1, wherein said auxiliary wing is selected from the materials consisting of metal and plastic.

6. The substrate transportation equipment of claim 1, wherein said auxiliary wing extends from said support body.

7. The substrate transportation equipment of claim 1, wherein said auxiliary wing comprises a second top surface for supporting the corners of said substrate.

8. The substrate transportation equipment of claim 7, wherein said auxiliary wing further comprises a pad disposed on said second top rim for avoid scratching said substrate.

9. The substrate transportation equipment of claim 1, wherein said support body and said auxiliary wing are integratedly formed.

10. The substrate transportation equipment of claim 1, wherein said auxiliary wing is a bended metal plate latched to said base with said support body.

11. A method for transporting a substrate, comprising:
providing a substrate transportation equipment comprising a base, a plurality of first supporting devices disposed on a first location of said base, a plurality of second supporting devices disposed on a second location of said base, and a working beam, disposed on said base, comprising a reciprocating movable protruding member between said first location and said second location;
substantially horizontally placing a substrate on said first supporting devices;
elevating said protruding member so that said protruding member replaces said first supporting devices to support said substrate;
moving said protruding member and said substrate thereon from said first location to said second location along said working beam;
lowering said protruding member so that said substrate is off said protruding member and substantially horizontally disposed on said second supporting devices; and
returning said protruding member to said first location.

12. The method of claim 11, wherein each said first and second supporting device comprises a support body and an auxiliary wing.

13. The method of claim 12, wherein said support body comprises a first top surface so that the rim of said substrate substantially horizontally lies on said first top surface and said auxiliary wing comprises a second top rim so that the corners of said substrate substantially horizontally lies on said second top rim.

14. The method of claim 13, wherein said first top surface is slightly lower than said second top rim.

15. The method of claim 12, wherein said support body further comprises a cushion on said first top surface.

16. The method of claim 12, wherein said auxiliary wing is made of a plastic material.

17. The method of claim 12, wherein said auxiliary wing further comprises a pad disposed on said second top rim.

18. The method of claim 12, wherein said auxiliary wing is detachably connected to said support body.

19. The method of claim 12, wherein the height of said auxiliary wing is between that of said support body and said protruding member.

20. The method of claim 11, wherein said substrate comprises a solar cell substrate.

* * * * *